United States Patent
König et al.

(10) Patent No.: US 12,243,959 B2
(45) Date of Patent: Mar. 4, 2025

(54) OPTOELECTRONIC SEMICONDUCTOR DEVICE AND METHOD OF MANUFACTURING AN OPTOELECTRONIC SEMICONDUCTOR DEVICE

(71) Applicant: OSRAM Opto Semiconductors GmbH, Regensburg (DE)

(72) Inventors: Harald König, Bernhardswald (DE); Jens Ebbecke, Rohr in Niederbayern (DE); Alfred Lell, Maxhuette-Haidhof (DE); Sven Gerhard, Alteglofsheim (DE); Clemens Vierheilig, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 63 days.

(21) Appl. No.: 17/229,051

(22) Filed: Apr. 13, 2021

(65) Prior Publication Data
US 2021/0234068 A1    Jul. 29, 2021

Related U.S. Application Data

(62) Division of application No. 16/409,527, filed on May 10, 2019, now Pat. No. 11,005,005.

(30) Foreign Application Priority Data

May 11, 2018 (DE) .......................... 102018111319.6

(51) Int. Cl.
*H01S 5/02* (2006.01)
*H01L 33/00* (2010.01)
(Continued)

(52) U.S. Cl.
CPC ............ *H01L 33/08* (2013.01); *H01L 33/007* (2013.01); *H01L 33/26* (2013.01); *H01S 5/0203* (2013.01)

(58) Field of Classification Search
CPC ............................. H01S 5/0203; H01S 5/0282
See application file for complete search history.

(56) References Cited

U.S. PATENT DOCUMENTS 5,294,815 A * 3/1994 Lechi .................... H01S 5/0203
257/85
5,627,851 A * 5/1997 Takahashi ............. H01S 5/0207
372/44.01
(Continued)

FOREIGN PATENT DOCUMENTS

CN        1509508 A     6/2004
CN      101933142 A    12/2010
(Continued)

*Primary Examiner* — Michael Carter
(74) *Attorney, Agent, or Firm* — Slater Matsil, LLP

(57) ABSTRACT

An optoelectronic semiconductor device and a method for manufacturing an optoelectronic semiconductor device are disclosed. In an embodiment an optoelectronic semiconductor device includes a semiconductor body having a first region of a first conductive type, an active region configured to generate electromagnetic radiation, a second region of a second conductive type and a coupling-out surface configured to couple-out the electromagnetic radiation, wherein the first region, the active region and the second region are arranged along a stacking direction, wherein the active region extends from a rear surface opposite the coupling-out surface to the coupling-out surface along a longitudinal direction transverse to or perpendicular to the stacking direction, and wherein the coupling-out surface is arranged plane-parallel to the rear surface.

13 Claims, 10 Drawing Sheets

(51) Int. Cl.
*H01L 33/08* (2010.01)
*H01L 33/26* (2010.01)

(56) References Cited

U.S. PATENT DOCUMENTS

| | | | |
|---|---|---|---|
| 8,290,012 | B2 | 10/2012 | Behfar et al. |
| 8,653,540 | B2 | 2/2014 | Engl et al. |
| 8,976,829 | B2 | 3/2015 | Koenig et al. |
| 9,099,843 | B1 | 8/2015 | Raring et al. |
| 9,343,871 | B1* | 5/2016 | Raring .............. H01S 5/320275 |
| 9,680,049 | B2 | 6/2017 | Plößl |
| 9,865,993 | B2 | 1/2018 | Stagarescu et al. |
| 10,559,939 | B1* | 2/2020 | Raring ................. H01S 5/0203 |
| 2001/0048702 | A1* | 12/2001 | Yoshida ................. H01S 5/146 |
| | | | 372/43.01 |
| 2002/0006726 | A1* | 1/2002 | Yamasaki ............. H01S 5/0201 |
| | | | 438/689 |
| 2003/0141499 | A1 | 7/2003 | Venkatraman et al. |
| 2004/0233950 | A1 | 11/2004 | Furukawa et al. |
| 2005/0069246 | A1* | 3/2005 | Kato ................. G02B 26/0841 |
| | | | 385/18 |
| 2005/0147145 | A1 | 7/2005 | Behfar et al. |
| 2007/0045637 | A1* | 3/2007 | Behfar .................. G11B 7/127 |
| | | | 257/79 |
| 2007/0096142 | A1* | 5/2007 | Tachibana ........... H01S 5/34333 |
| | | | 257/E33.005 |
| 2008/0191223 | A1* | 8/2008 | Nakamura ................ H01S 5/22 |
| | | | 438/33 |
| 2010/0258892 | A1 | 10/2010 | Butendeich et al. |
| 2012/0273956 | A1 | 11/2012 | Watanabe |
| 2014/0003765 | A1* | 1/2014 | Tseng ...................... H01L 23/48 |
| | | | 438/26 |
| 2014/0346557 | A1 | 11/2014 | Yoshida et al. |
| 2016/0094015 | A1* | 3/2016 | Hashimoto ............. H01S 5/125 |
| | | | 372/45.012 |
| 2017/0012408 | A1* | 1/2017 | Hashimoto ............. H01S 5/125 |
| 2017/0331019 | A1 | 11/2017 | Schwarz et al. |
| 2018/0130925 | A1 | 5/2018 | Weiss |

FOREIGN PATENT DOCUMENTS

| | | |
|---|---|---|
| CN | 102176502 A | 9/2011 |
| CN | 102893466 A | 1/2013 |
| CN | 105122472 A | 12/2015 |
| CN | 107078131 A | 8/2017 |
| JP | H07142763 A | 6/1995 |
| JP | H08279656 A | 10/1996 |
| JP | H09289357 A | 11/1997 |
| JP | H1041584 A | 2/1998 |
| JP | H1041585 A | 2/1998 |
| JP | 2000004066 A | 1/2000 |
| JP | 2004260058 A | 9/2004 |
| JP | 2009506550 A | 2/2009 |
| JP | 2011181604 A | 9/2011 |
| JP | 2015519008 A | 7/2015 |
| WO | 2016135024 A1 | 9/2016 |

* cited by examiner

OPTOELECTRONIC SEMICONDUCTOR DEVICE AND METHOD OF MANUFACTURING AN OPTOELECTRONIC SEMICONDUCTOR DEVICE

CROSS-REFERENCE TO RELATED APPLICATIONS

This is a divisional application of U.S. application Ser. No. 16/409,527, entitled, "Optoelectronic Semiconductor Device and Method of Manufacturing an Optoelectronic Semiconductor Device," which was filed on May 10, 2019, which claims the priority of German patent application 102018111319.6, filed on May 11, 2018, which application is hereby incorporated herein by reference.

TECHNICAL FIELD

An optoelectronic semiconductor device and a method for manufacturing an optoelectronic semiconductor device are provided. An optoelectronic semiconductor device can be a radiation-emitting optoelectronic semiconductor device configured to emit electromagnetic radiation, such as light, during operation.

SUMMARY

Embodiments provide an optoelectronic semiconductor device that has improved reliability.

Embodiments provide a method for manufacturing an optoelectronic semiconductor device that enables simplified manufacturing.

According to at least one embodiment of the optoelectronic semiconductor device, the optoelectronic semiconductor device has a semiconductor body comprising, along a stacking direction, a first region of a first conductive type, an active region designed to generate electromagnetic radiation, and a second region of a second conductive type. Furthermore, the semiconductor body has a coupling-out surface which is intended for coupling-out electromagnetic radiation generated during operation. The coupling-out surface, for example, runs transversely or perpendicular to the stacking direction.

The active region extends from a rear surface opposite the coupling-out surface to the coupling-out surface along a longitudinal direction transverse or perpendicular to the stacking direction. The active region preferably comprises a pn-junction, a double heterostructure, a single quantum well (SQW) or, especially preferred, a multi quantum well (MQW) for radiation generation.

The regions of the semiconductor body are preferably grown epitaxially. The first region and the second region of the semiconductor body each have a different type of conductivity. The formation of a conductive type is preferably carried out by doping the semiconductor material. A p-conductive type is created, for example, by doping with an acceptor material. The formation of an n-conductive type is carried out, for example, by doping with a donor material.

In particular, the coupling-out surface is arranged plane-parallel to the rear surface.

According to at least one embodiment of the optoelectronic semiconductor device, both the coupling-out surface and the rear surface of the semiconductor body are produced by means of an etching process.

The feature according to which the coupling-out surface and the rear surface of the semiconductor body are produced by means of an etching process is not a pure method feature, but can be detected on the finished component and is therefore also an objective feature. Characteristics for a surface produced by means of an etching process are, in particular, irregularities in the surface of the coupling-out surface and/or the rear surface depending on the material composition, caused by slightly different etching rates in different materials and/or steps on the surface of the rear surface and the coupling-out surface. A further characteristic of an etching process is the distance of less than 30 μm between the coupling-out surface and the rear surface. Such a small distance between the coupling-out surface and the rear surface can hardly be produced with a scribing and breaking process at present.

The marks are generated by at least one etching of the semiconductor body. The characteristics can be verified on the finished semiconductor device, for example, by means of electron microscopic images or under a light microscope.

According to at least one embodiment of the optoelectronic semiconductor device, the optoelectronic semiconductor device has a semiconductor body comprising a first region of a first conductive type, an active region designed to generate electromagnetic radiation, a second region of a second conductive type, and the a coupling-out surface configured to couple-out electromagnetic radiation, wherein the first region, the active region, and the second region are arranged along a stacking direction, wherein the active region extends from a rear surface opposite the coupling-out surface to the coupling-out surface along a longitudinal direction, which extends transverse to or perpendicular to the stacking direction, wherein the coupling-out surface is arranged plane-parallel to the rear surface, and wherein the coupling-out surface and the rear surface of the semiconductor body are produced by means of an etching process.

Embodiments of the optoelectronic semiconductor device described here are based, among other things, on the following considerations. In the manufacture of edge-emitting semiconductor laser diodes, it is particularly necessary to produce the coupling-out surfaces and the rear surfaces (facet surfaces) as plane-parallel as possible to each other as well as smooth and even by means of a suitable method. An increased surface roughness results in reduced reflectivity and can also lead to premature component failure. Surface defects can cause catastrophic optical damage (COD) to the facet surfaces, resulting in a total failure of the component.

A scribing and breaking process could be used to produce suitable facet surfaces. The fracture axis is selected along a crystal plane of the semiconductor. This results in a smooth fracture line along this selected crystal axis, which guarantees plane-parallelism and reduces the surface roughness to just a few nanometers. A disadvantage of a scribing and breaking process, however, is the high proportion of faulty components due to facet surfaces that are not broken cleanly and the immediate separation of the individual semiconductor laser diodes. As a result, it is no longer possible to carry out further processes on the facets of the components to be produced in a composite, in particular a wafer composite. Rather, each semiconductor device must be processed individually or several components must be combined into a group for joint processing by means of an additional process and then separated from each other again.

In addition, the minimum length of the semiconductor laser diodes is limited to a relatively high value when separated by a scribing and breaking process, since the power required for the breaking process increases sharply with decreasing length.

Furthermore, the use of a scribing and breaking process is also limited to the use of a breakable substrate, which further restricts the freedom in design for the optoelectronic semiconductor device.

The optoelectronic semiconductor device described here makes use, among other things, of the idea of using an etching process instead of a scribing and breaking process to produce the facet surfaces. This makes it possible to produce the facets in a wafer composite. A chemical polishing process is used to ensure low surface roughness and high plane-parallelism of the facets.

According to at least one embodiment of the optoelectronic semiconductor device, the optoelectronic semiconductor device is designed to generate coherent radiation. In other words, the optoelectronic semiconductor device can be an edge-emitting semiconductor laser diode that emits laser radiation during operation. The coupling-out surface and the rear surface of the semiconductor body serve as laser facets and represent resonator mirrors of the semiconductor laser diode.

According to at least one embodiment of the optoelectronic semiconductor device, the semiconductor body has an extension in the longitudinal direction of less than 300 µm, preferably of less than 100 µm and particularly preferably of less than 50 µm. The minimum length of the semiconductor body in a longitudinal direction is limited to a minimum length in a scribing and breaking process. By using an etching process this restriction is obsolete. Semiconductor laser diodes with an extension of less than 300 µm can have an advantageously low gain.

According to at least one embodiment of the optoelectronic semiconductor device, at least one region of the semiconductor body, in particular the entire semiconductor body, is based on a nitride compound semiconductor material. "Based on nitride compound semiconductor material" in this context means that the semiconductor body or at least a part thereof, preferably comprises or consists of $Al_n Ga_m In_{1-n-m} N$, wherein $0 \leq n \leq 1$, $0 \leq m \leq 1$ and $n+m \leq 1$. This material does not necessarily have to have a mathematically exact composition according to the above formula. Rather, it may, for example, contain one or more dopants and additional components. For simplicity's sake, however, the above formula contains only the essential components of the crystal lattice (Al, Ga, In, N), even if these may be partially replaced and/or supplemented by small quantities of other substances.

The p-conductive type, for example, in the first region of the semiconductor body, is formed by doping with a material such as magnesium. The formation of an n-conductive type, for example, in the second region of the semiconductor body, takes place, for example, by doping with a material such as silicon.

According to at least one embodiment of the optoelectronic semiconductor device, the coupling-out surface and the rear surface run parallel to the m-plane of the crystal of the semiconductor body. The m-plane is the [1100]-plane of a crystal with a hexagonal basic structure of the wurtzite type. Due to the plane-parallelism of two opposite m-planes, the alignment of the coupling-out surface to the rear surface is plane-parallel to each other. This allows the formation of a resonator between the coupling-out surface and the rear surface.

According to at least one embodiment of the optoelectronic semiconductor device, the optoelectronic semiconductor device comprises a growth substrate, the semiconductor body is deposited on the growth substrate, and the growth substrate is formed with one of the following materials: Sapphire, gallium nitride, silicon carbide, silicon. Gallium nitride and silicon carbide can also be used in a scribing and breaking process and have a lower defect density than sapphire. Sapphire and silicon are difficult or impossible to process in a scribing and breaking process. Thus, the use of an etching process advantageously creates greater freedom of design for the optoelectronic semiconductor device.

According to at least one embodiment of the optoelectronic semiconductor device, the coupling-out surface and the rear surface have an average roughness in a range from 0.1 nm to 10 nm and preferably from 0.1 nm to 1 nm. The mean roughness is defined as the mean distance of a measuring point on the surface to the imaginary centerline of the surface contour. A low average roughness is advantageous for a high reflectivity of the coupling-out surface and the rear surface. A high optical reflectivity is particularly advantageous for forming laser facets. Chemical polishing of the coupling-out surface and the rear surface is advantageous in order to achieve small values of the average roughness. In particular, the use of TMAH (tetramethylammonium hydroxide) as an etchant in a chemical polishing process results in advantageously low roughness values.

According to at least one embodiment of the optoelectronic semiconductor device, a mirror is arranged downstream of the rear surface and/or the coupling-out surface on the side facing away from the semiconductor body. This mirror, for example, can be designed as a DBR mirror (distributed bragg reflector). This mirror comprises a periodic sequence of several layers with varying refractive index. A DBR mirror is characterized in particular by a high reflectivity in a spectrally very small wavelength range. This makes it possible to produce a semiconductor laser diode with a very narrow-band emission spectrum. The DBR mirror can be in direct contact with the semiconductor body and generated on the semiconductor body. In other words, the DBR mirror is produced by structuring the semiconductor body. A plurality of trench-shaped recesses arranged one behind the other form a periodic sequence of varying refractive indices in a cross-section at the transition between the material of the semiconductor body and the recesses.

Furthermore, the semiconductor body may contain a DFB mirror (distributed feedback). A DFB mirror comprises a periodic sequence of refractive index variations along an imaginary connecting line between the coupling-out surface and the rear surface. While a DBR mirror is arranged on the side of the coupling-out surface facing away from the semiconductor body and/or the rear surface, a DFB mirror is arranged between the rear surface and the coupling-out surface.

According to at least one embodiment of the optoelectronic semiconductor device, the mirror is produced with the material of the semiconductor body. By introducing recesses in the semiconductor body, regions with a different refractive index are created. For example, these recesses can also be filled with a transparent material such as air or a plastic material or dielectric whose refractive index differs from that of the semiconductor body. Along the longitudinal direction, the recesses have a defined periodic distance, resulting in a periodic refractive index variation. By generating the mirror with the material of the semiconductor body, the application of a plurality of dielectric layers can be advantageously omitted.

According to at least one embodiment of the optoelectronic semiconductor device, the first region on the coupling-out surface has at least one step in the longitudinal direction. This step is a projection or overhang transverse to the stacking direction of the material of the first region beyond an imaginary plane of the coupling-out surface. In particular, the optoelectronic semiconductor device may also have a plurality of steps.

According to at least one embodiment of the optoelectronic semiconductor device, the step is structured such that the electromagnetic radiation emitted from the semiconductor body does not strike the step. In other words, the width of the step and the height of the step are chosen in such a way that the radiation emitted by the optoelectronic semiconductor device can propagate particularly unhindered. The structuring of the at least one step can, for example, be carried out by means of an etching process.

According to at least one embodiment of the optoelectronic semiconductor device, the width $b_n$ of the at least one step of the first region in the longitudinal direction is structured in such a way that it satisfies the following formula except for a deviation of +/−10%, preferably except for a deviation of +/−5%: $b_n < [(h_n - a - w)/\tan(\alpha/2)] - (b_{n-1} - b_{n-2} - \ldots - b_2 - b_1)$. Wherein b is defined as the width of the step of the first region across the coupling-out surface, a is the distance of the active region from the side of the second region remote from the active region, $h_n$ is the extent of the coupling-out surface in a direction parallel to the stacking direction of the semiconductor body, w is the waveguide thickness on the side of the first region remote from the active region, and α is the vertical far field angle. The index n stands for a number of steps. Such structured steps of the first region of the semiconductor body prevent the shadowing of the emitted light by the first region particularly efficiently.

According to further embodiments a method for manufacturing an optoelectronic semiconductor device is also provided. In particular, a semiconductor device described here can be manufactured using this method. This means that all features described for the semiconductor device are also revealed for the method and vice versa.

According to at least one embodiment of a method for manufacturing an optoelectronic semiconductor device, the method comprises the following step:

Providing a semiconductor body comprising, along a stacking direction, a first region of a first conductive type, an active region designed to generate electromagnetic radiation, and a second region of a second conductive type. The active region extends between the first region and the second region along a longitudinal direction transverse or perpendicular to the stacking direction.

According to at least one embodiment of the method, a first trench is inserted at least in places along the stacking direction and transversely to the longitudinal direction by means of a first etching process. This first trench completely penetrates the first region and the active region. Thereby the side surface of the first trench facing the semiconductor body is provided with a coupling-out surface for coupling-out electromagnetic radiation. In particular, this first etching process generates a step on the coupling-out surface that can be detected on the finished semiconductor device.

According to at least one embodiment of the method, the insertion of a second trench on the side of the semiconductor body opposite the first trench takes place at least in places along the stacking direction of the semiconductor body and transversely to the longitudinal direction by means of the first etching process. The second trench completely penetrates the first region and the active region. This creates a rear surface on the side surface of the second trench facing the semiconductor body. In particular, this first etching process generates a step on the rear surface that can be detected on the finished semiconductor device.

The first etching process preferably comprises a plasma etching process using chlorine- and argon-ions, a laser ablation process, or a photochemical wet etching process. For example, the etch region of the first trench and the second trench may be limited by a mask layer that protects the active region from the influence of the etchant.

According to at least one embodiment of the method, the smoothing of the coupling-out surface and the rear surface is carried out by means of a second etching process. This second etching process serves in particular to prepare the m-plane of the semiconductor crystal. The m-plane is the [1$\bar{1}$00]-plane of a crystal with a hexagonal basic structure of the wurtzite type. The second etching process is preferably carried out wet-chemically using, for example, KOH, NaOH, $NH_4OH$, LiOH, TMAH, NMP (N-methyl-2-pyrrolidone). Surprisingly, it turned out that the use of TMAH results in a particularly good preparation of the individual crystal planes of the semiconductor body. This means that using TMAH as a second etchant results in a particularly low average roughness of the facet surfaces. In particular, this second etching process generates characteristics that are detectable on the finished semiconductor device.

According to at least one embodiment of the method, the second etchant comprises one of the following etchants: KOH, NaOH, $NH_4OH$, LiOH, TMAH or NMP. These wet-chemical etching processes reduce the surface roughness of the facet surfaces and thus improve the surface quality.

According to at least one embodiment of the method, the coupling-out surface and the rear surface are cleaned by ion cleaning. Ion cleaning is carried out, for example, with low-energy ions such as nitrogen ions, argon ions, hydrogen plasma, oxygen plasma or xenon ions. A facet surface which is ion-cleaned preferably shows no more impurities by foreign material.

According to at least one embodiment of the method, the coupling-out surface and the rear surface are coated with a semi-crystalline material. As semi-crystalline material aluminum nitride, silicon nitride, aluminum oxynitride, silicon oxynitride, silicon, aluminum oxide, gallium nitride, zinc selenide, gallium arsenide, gallium phosphide and ternary and/or quaternary compounds can be used. The semi-crystalline material is mainly used to passivate the coupling-out surface and the rear surface. In particular, the semi-crystalline material can be deposited on the coupling-out surface and the rear surface by means of a sputtering process or an ALD (atomic layer deposition) process. In an ALD process, a monolayer of atoms can be deposited. The deposition of the monolayer can take place by deposition of several sub-monolayers, for example, by means of an organometallic precursor such as trimethylaluminum. The methyl groups prevent a complete monolayer by sterically hindering the individual ligands and thus form a submonolayer. This cycle can be repeated several times until a monolayer is formed from several submonolayers. Thus, no atomic layers stacked on top of each other are formed, but only a monatomic layer is deposited on one surface. The advantage of such a monolayer is a very good coverage of the surface and the overmolding of even the smallest particles and unevenness. This results in a very dense layer, which can advantageously provide a good diffusion barrier.

According to at least one embodiment of the method, the coupling-out surface and the rear surface are coated with a dielectric material or a metal. The coating of the coupling-out surface and the rear surface with a dielectric material or a metal serves to adjust the desired reflectivity and thus to determine the optical parameters of the optoelectronic semiconductor device. The layer of dielectric material or metal can be deposited by sputtering, evaporation, CVD (chemical vapor deposition) or as ALD layer. Materials such as silicon nitride, aluminum oxide, aluminum oxynitride, silicon oxynitride, tantalum oxide, silicon dioxide or silicon can be used.

According to at least one embodiment of the method, a step of the first region is structured over the coupling-out surface in the longitudinal direction by means of an etching process. This structuring prevents shadowing of the diverging electromagnetic radiation emitted from the active region at the coupling-out surface and can simultaneously serve to separate the individual optoelectronic semiconductor devices. For example, a plasma etching process is used for the structuring. In particular, this method step can also be carried out before cleaning the coupling-out surface and the rear surface by using ion cleaning.

According to at least one embodiment of a method for manufacturing an optoelectronic semiconductor device, the process steps described here are carried out on a plurality of optoelectronic semiconductor devices in a wafer composite. In other words, the method steps described here take place before the optoelectronic semiconductor devices are separated from the wafer composite. A wafer composite is characterized by a plurality of optoelectronic semiconductor devices that are monolithically formed on a common growth substrate. All process steps described here are carried out before the individual optoelectronic semiconductor devices are separated. This results in a major production advantage, in particular due to the compatibility of the method steps with already established processes from the manufacture of light emitting diodes. An elaborate combination of the individual optoelectronic semiconductor devices for mirror coating by merging and untethering can be advantageously omitted.

BRIEF DESCRIPTION OF THE DRAWINGS

Further advantages and advantageous embodiments and further designs of the optoelectronic semiconductor device result from the following exemplary embodiments in connection with the figures.

Showing in.

Same, similar or equivalent elements are provided with the same reference signs in the figures. The figures and the proportions of the elements depicted in the figures are not to be regarded as true to scale. Rather, individual elements may be exaggeratedly large for better representability and/or better comprehensibility.

DETAILED DESCRIPTION OF ILLUSTRATIVE EMBODIMENTS

Figure 1A:
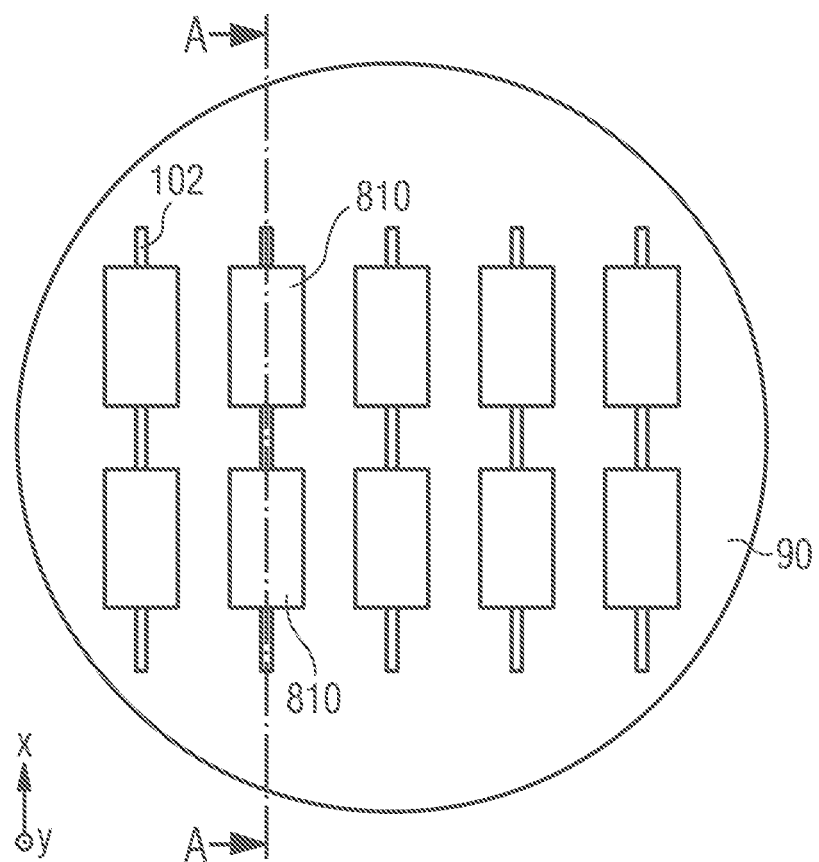
FIGS. 1A, 2A, 3A, 4A, 5A and 6A show schematic representations of a top view of a wafer composite with a plurality of optoelectronic semiconductor devices in various steps of production according to an exemplary embodiment of a method.
Figure 1B:
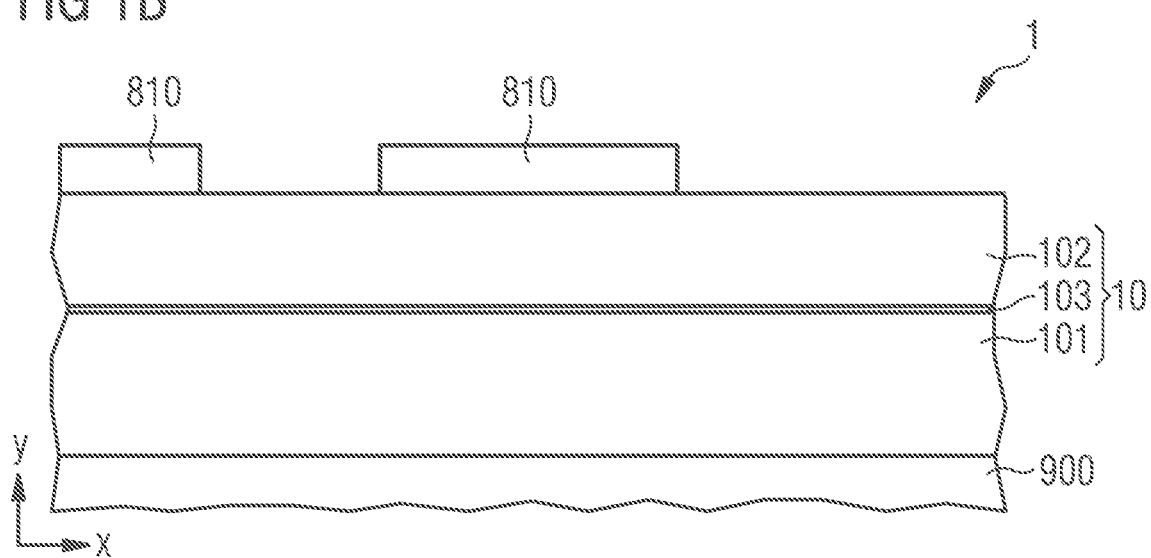
FIGS. 1B, 2B, 3B, 4B, 5B and 6B show schematic cross-sections through an optoelectronic semiconductor device according to a first exemplary embodiment in different steps of its manufacturing according to the exemplary embodiment of a method.

FIG. 1A shows a schematic representation of a top view of a wafer 90 with a plurality of optoelectronic semiconductor devices 1 in a first step of its manufacturing. The wafer 90 comprises a growth substrate 900, in particular sapphire. The wafer 90 further comprises a plurality of first contact structures 810 as well as a plurality of second regions 102. The first contact structures 810 are formed, for example, with a metal or a metal alloy and serve for electrical contacting of the optoelectronic semiconductor device 1. The second regions 102 have a second conductive type and are preferably epitaxially grown.

FIG. 18 shows a schematic cross-section through an optoelectronic semiconductor device 1 according to the first exemplary embodiment. The sectional view of an optoelectronic semiconductor device 1 shown here corresponds to a cut through the wafer 90, shown in FIG. 1A, along the cutting line A. The optoelectronic semiconductor device 1 comprises a first contact structure 810, a second region 102, an active region 103 and a first region 101, which together are associated with a semiconductor body 10. The regions of the semiconductor body 10 are preferably epitaxially grown on the growth substrate 900. The first region 101 has a first conductive type, the second region 102 has a second conductive type, and the active region 103 is designed for generating electromagnetic radiation.

Figure 2A:
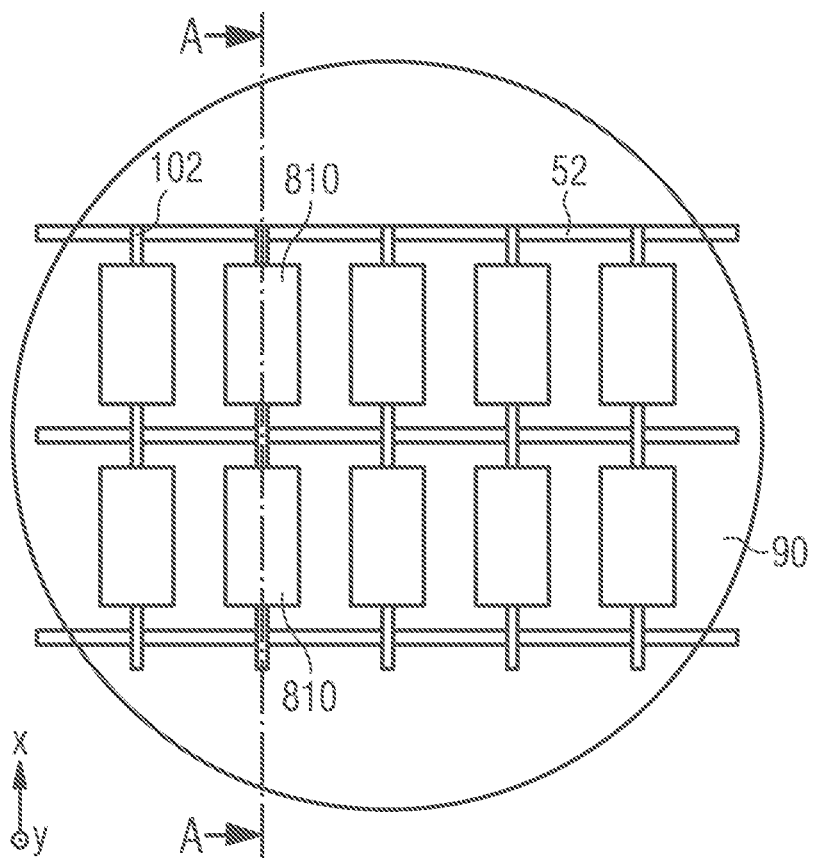

FIG. 2A shows a mask layer 50 applied to the side of the second region 102 and the first contact structures 810 facing away from the active region 103. For structuring, a number of recesses have been made in the mask layer 52.

Figure 2B:
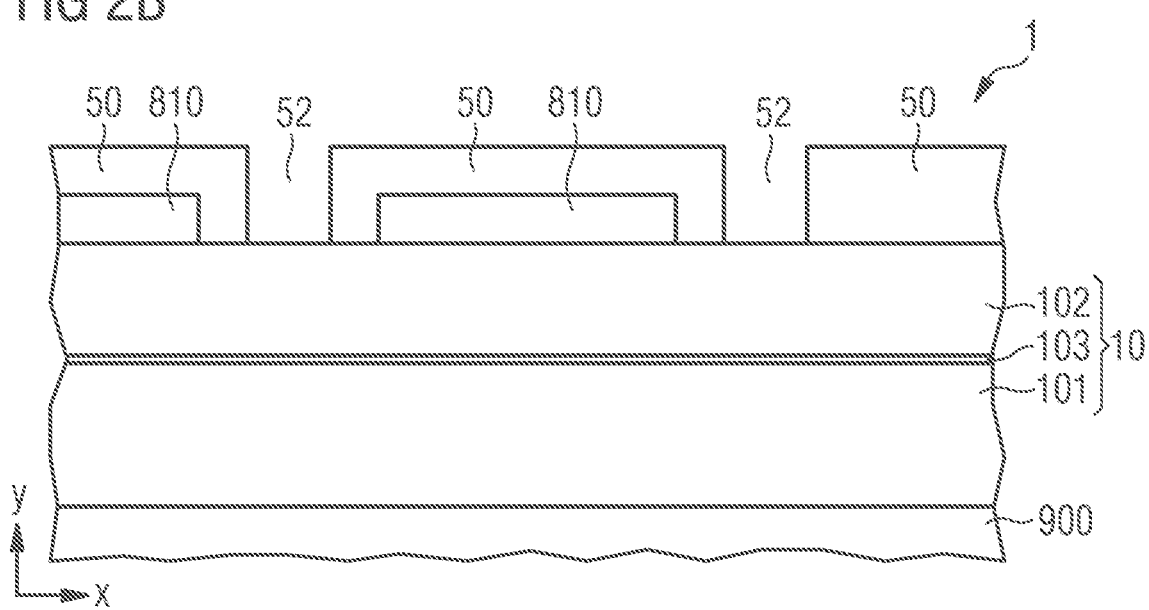

FIG. 2B shows a schematic cross-section through an optoelectronic semiconductor device 1 according to the first exemplary embodiment. The sectional view of an optoelectronic semiconductor device 1 shown here corresponds to a cut through the wafer 90, shown in FIG. 2A, along the cutting line A. In this further method step, a mask 50 is applied to the upper side of the optoelectronic semiconductor device 1. The mask 50 has a plurality of recesses in the mask layer 52, which defines the region of the optoelectronic semiconductor device 1 to be processed further and protects the regions not to be processed.

Figure 3A:
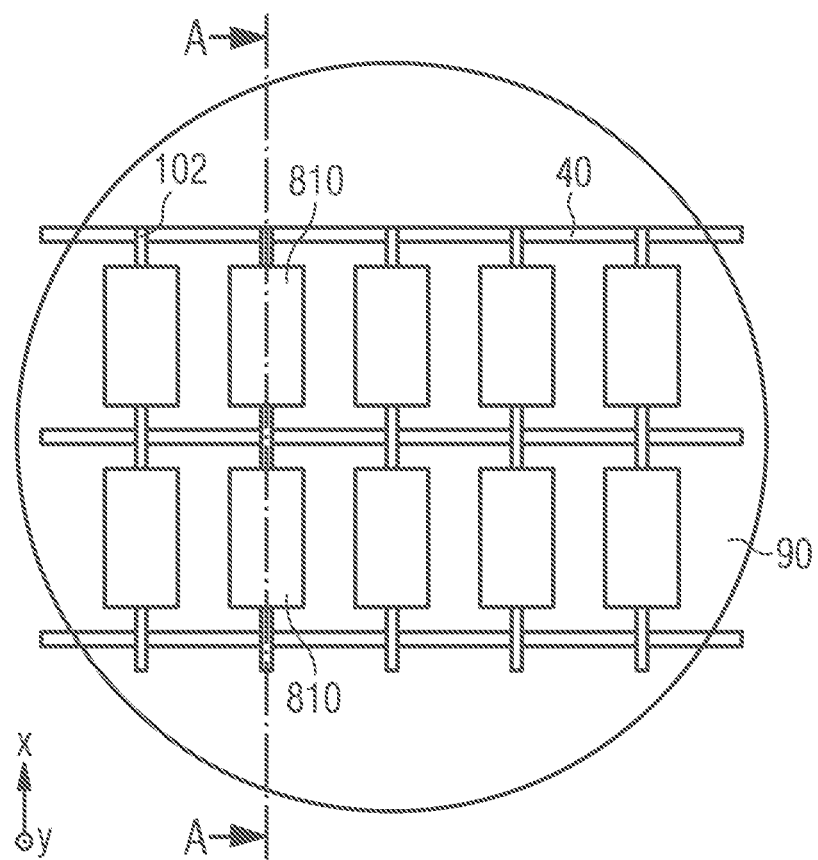

FIG. 3A shows the position of trench-shaped recesses 40, which are generated by means of a plasma etching process. The etching process generates an etching of the semiconductor body 10 at the locations of the recesses in the mask layer 52.

Figure 3B:
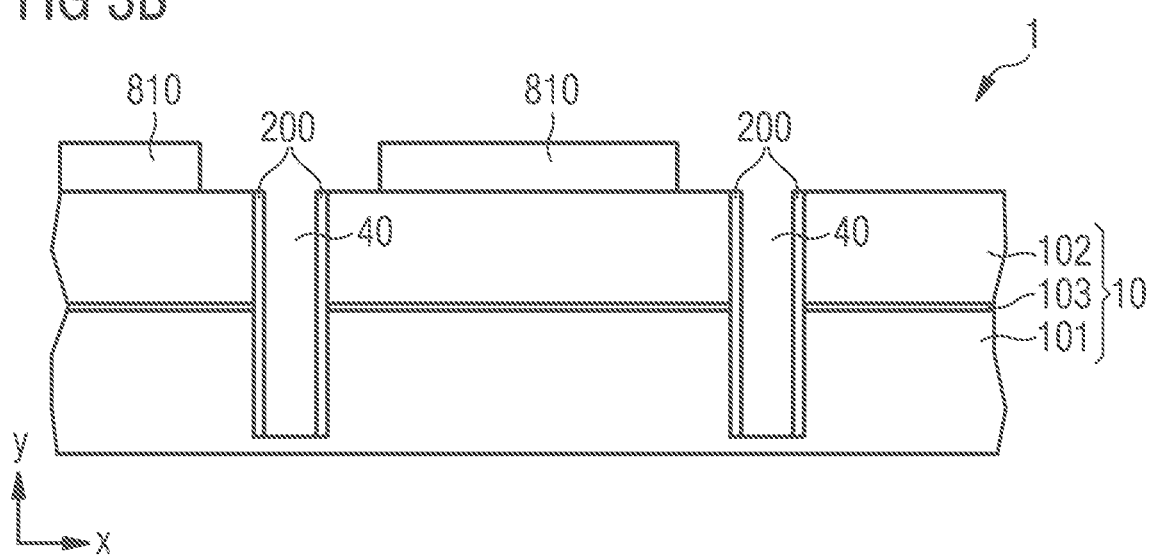

FIG. 3B shows a schematic cross-section through an optoelectronic semiconductor device 1 according to the first exemplary embodiment. The sectional view of an optoelectronic semiconductor device 1 shown here corresponds to a cut through the wafer 90, shown in FIG. 3A, along the cutting line A. A plurality of recesses 40 are introduced in the optoelectronic semiconductor device 1. This can be done, for example, by a plasma etching process or another dry chemical etching process. The recesses 40 completely penetrate the second region 102 and the active region 103. This results in irregularities and damaged regions 200 to the surface of the side walls of the recesses 40. To remove this damaged regions 200, a further etching process follows within the recesses 40. One of the following wet chemical etching agents can be used: KOH, NaOH, NH$_4$OH, LiOH, TMAH, NMP. The mask layer 50 is then removed.

Figure 4A:
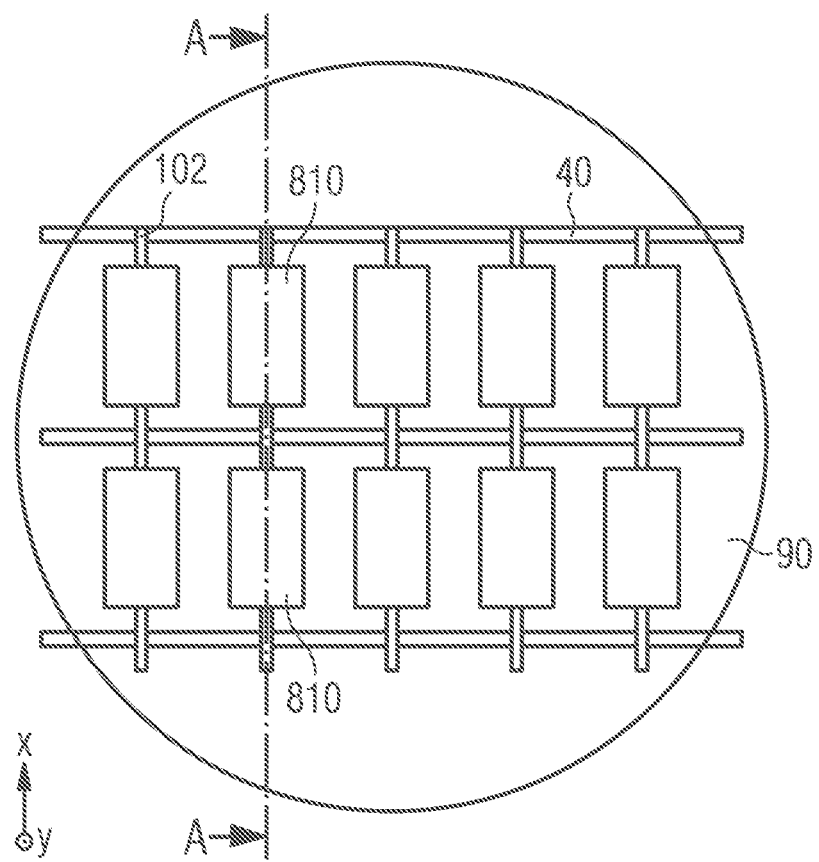

FIG. 4A schematically shows an ion cleaning process on the side walls of the recesses 40, by means of which etching residues and other foreign materials are removed.

Figure 4B:
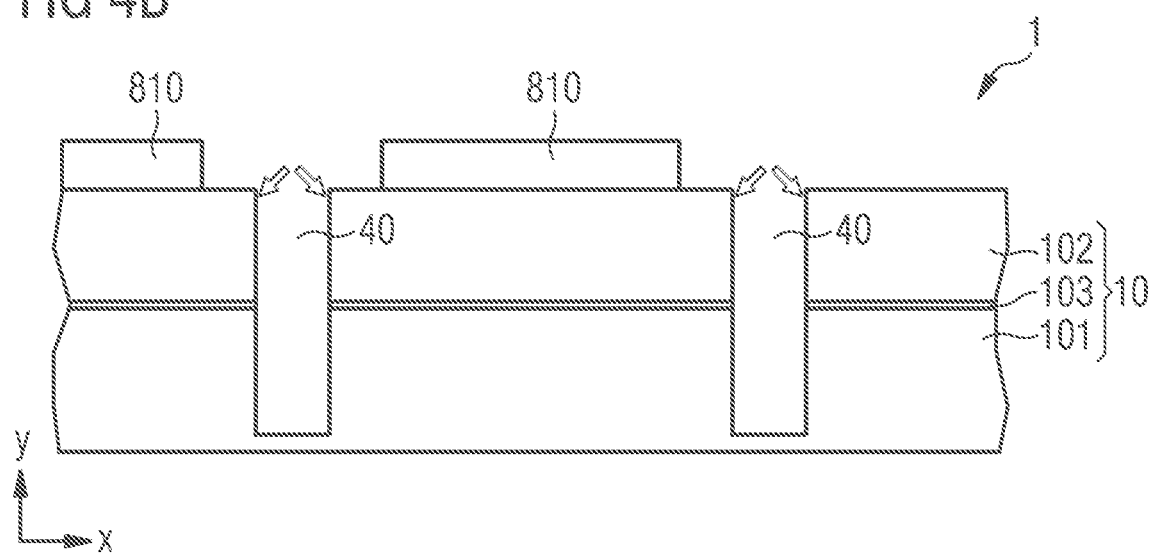

FIG. 4B shows a schematic cross-section through an optoelectronic semiconductor device 1 according to the first exemplary embodiment. The sectional view of an optoelectronic semiconductor device 1 shown here corresponds to a cut through the wafer 90 shown in FIG. 4A along cutting line A. The ion cleaning is, for example, carried out by means of nitrogen ions, argon ions, hydrogen plasma, oxygen plasma or xenon ions of low kinetic energy. This allows etching residues or other foreign materials to be removed from the side surfaces of the recesses 40 in order to obtain the cleanest possible facet surface.

Figure 5A:
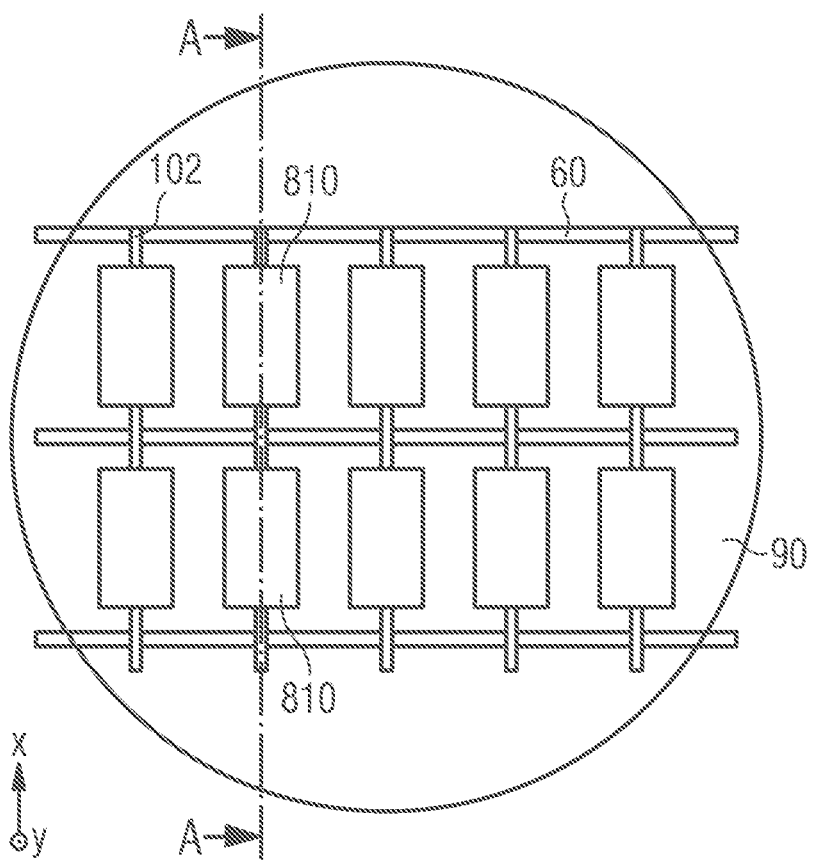

FIG. 5A shows a passivation 60 applied to the side surfaces of the recesses 40 by means of a coating process.

Figure 5B:
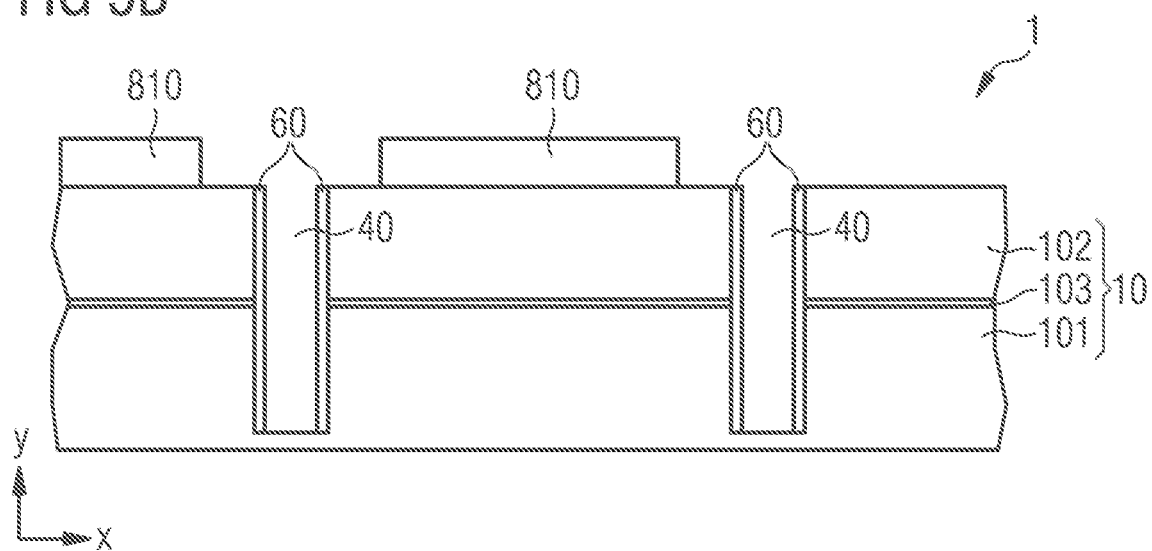

FIG. 5B shows a schematic cross-section through an optoelectronic semiconductor device 1 according to the first exemplary embodiment. The sectional view of an optoelectronic semiconductor device 1 shown here corresponds to a cut through the wafer 90 shown in FIG. 5A along the cutting line A. The side faces of the recesses 40 are coated with a semi-crystalline material such as aluminum nitride, silicon, aluminum oxynitride, silicon oxynitride, aluminum oxide, gallium nitride, zinc selenide, gallium arsenide, gallium phosphide, silicon nitride or another ternary or quaternary compound to form a passivation 60. The passivation 60 prevents damage to the active region 103 or the first region 101 or the second region 102 from external environmental influences such as moisture.

Figure 6A:
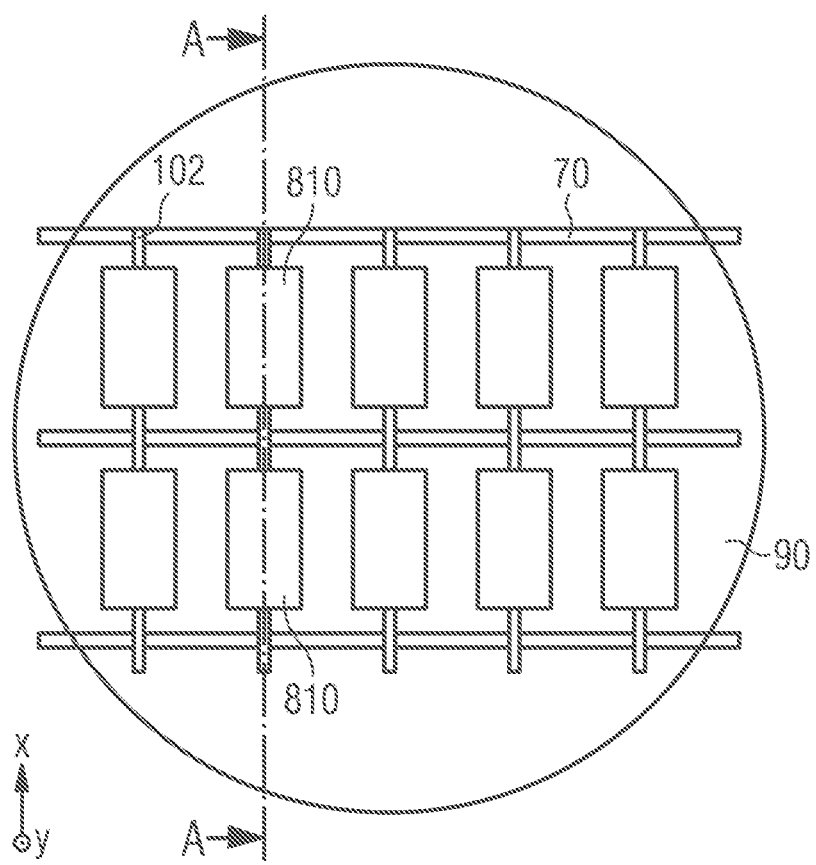

FIG. 6A shows a mirror layer 70 which is applied to the side surfaces of the recesses 40 by means of a further coating process.

Figure 6B:
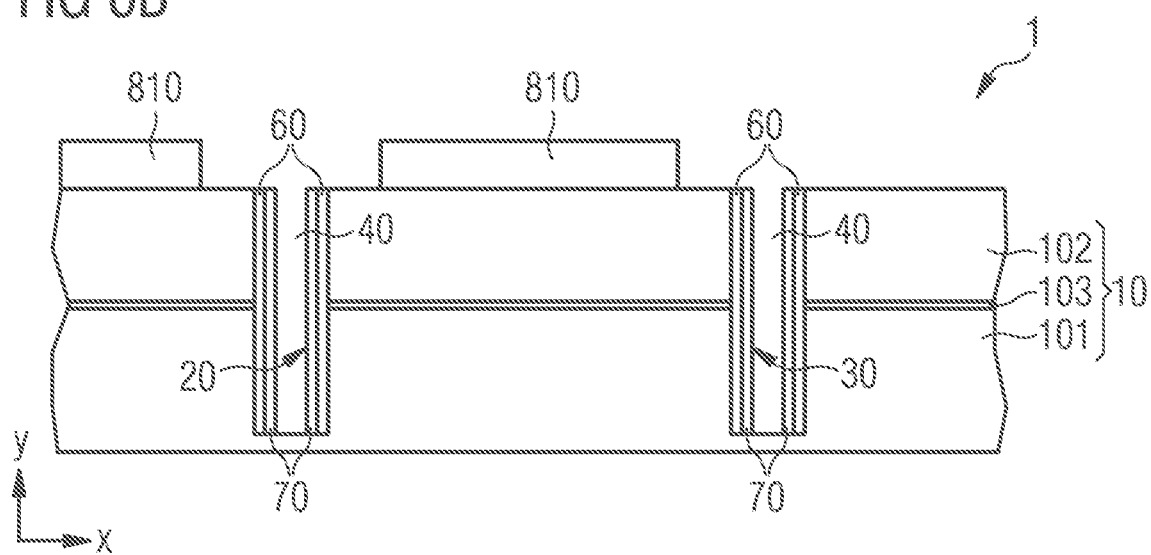

FIG. 6B shows a schematic cross-section through an optoelectronic semiconductor device 1 according to the first exemplary embodiment. The sectional view of an optoelectronic semiconductor device 1 shown here corresponds to a cut through the wafer 90 shown in FIG. 6A along cutting line A. A mirror layer 70 is applied to the passivation layer 60 inside the recesses 40. The mirror layer 70, for example, comprises a metal layer or one or more layers of one or more dielectrics. The mirror layer 70 may contain or be formed from silicon nitride, aluminum oxide, aluminum oxynitride, tantalum oxide, silicon dioxide or silicon. The mirror layer 70 is applied, for example, by sputtering, vapor deposition, CVD or an ALD process. By applying the mirror layer 70, a defined reflectivity of the coupling-out surface 20 and the rear surface 30 of the optoelectronic semiconductor device 1 can be achieved.

FIGS. 1A, 2A, 3A, 4A, 5A, and 6A each show a top view of a wafer 90 at different steps of the fabrication method for a plurality of optoelectronic semiconductor devices 1. In particular, it can be seen that all the method steps shown here can be carried out advantageously in a wafer composite. The structuring of the wafer is carried out by inserting a plurality of recesses 40 in the form of trenches. Further processing, which includes polishing the side surfaces of the trenches as well as passivation and subsequent coating of the side surfaces of the trenches, can also be carried out in the wafer composite. This simplifies production and reduces the cost per device produced.

Figure 7:
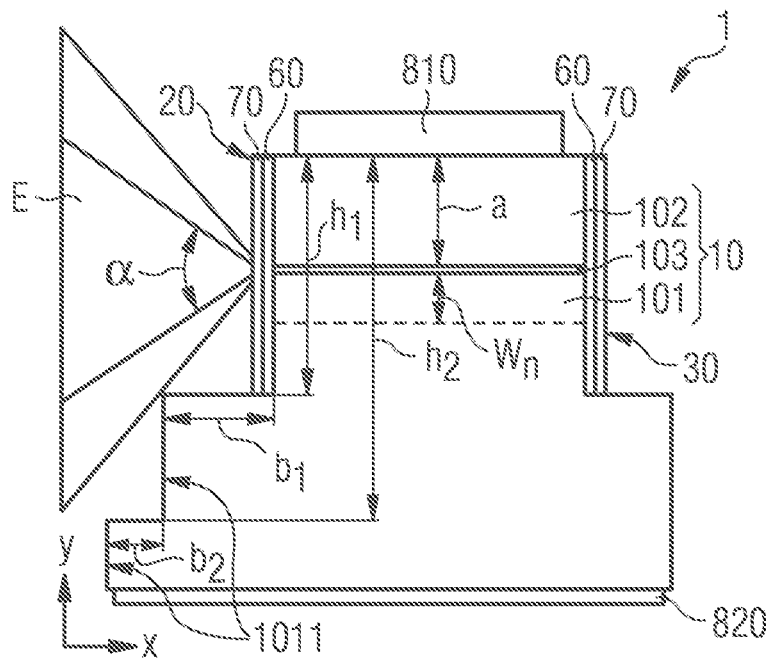
FIG. 7 shows a schematic cross-section through an optoelectronic semiconductor device according to the first exemplary embodiment.

FIG. 7 shows a schematic cross-section through an optoelectronic semiconductor device 1 according to the first exemplary embodiment. The optoelectronic semiconductor device 1 comprises a semiconductor body 10 having a second region 102, an active region 103 and a first region 101. A first contact structure 810 is arranged on the side of the second region 102 facing away from the active region 103. A second contact structure 820 is arranged on the side of the first region 101 facing away from the active region 103. The first contact structure 810 and the second contact structure 820, for example, are formed with a metal such as gold and are intended for the electrical connection of the semiconductor body 10. At the end surfaces of the semiconductor body 10 a coupling-out surface 20 and a rear surface 30 are attached. The coupling-out surface 20 is arranged plane-parallel to the rear surface 30 and serves the coupling-out of electromagnetic radiation E generated in the active region 103. On the coupling-out surface 20 as well as on the rear surface 30 a layer sequence of passivation 60 and mirror layer 70 is applied.

The first region 101 is structured according to the formula $b_n < [(h_n - a - w)/\tan(\alpha/2)] - (b_{n-1} - b_{n-2} - \ldots - b_2 - b_1)$. In this concrete example with two steps 1011, the width $b_1$ of the first step 1011 is now $b_1 < (h_1 - a - w)/\tan(\alpha/2)$ and the width $b_2$ of the second step 1011 is $b_2 < [(h_2 - a - w)/\tan(\alpha/2)] - b_1$ according to this formula. The variable a denotes the distance of the active region 103 from the side of the second region 102 remote from the active region 103; the variable $h_1$ denotes the first etch depth of the recess 40 measured from the side of the second region 102 remote from the active region 103; the variable $h_2$ denotes the second etch depth of another recess measured from the side of the second region 102 remote from the active region 103. The variable w denotes the thickness of a waveguide region within the first region 101 adjacent to the active region 103. The waveguide region is used for the optical guidance of the electromagnetic radiation generated in the active region 103. The variable α denotes the vertical far field angle of the electromagnetic radiation E emitted from the coupling-out surface 20. If the two steps 1011 are structured according to the above formula, a shadowing of the emitted electromagnetic radiation E by the material of the first region 101 is avoided and the electromagnetic radiation E can leave the optoelectronic semiconductor device 1 particularly unhindered.

Figure 8A:
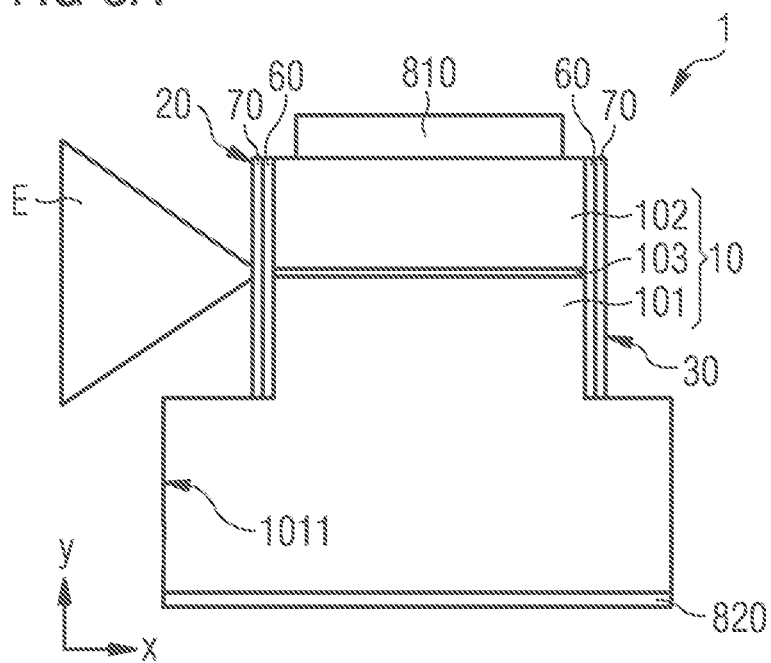
FIGS. 8A to 8C show an optoelectronic semiconductor device according to the first exemplary embodiment in various schematic sections and views.

FIG. 8A shows a schematic side view of an optoelectronic semiconductor device 1 according to the first exemplary embodiment. In contrast to the exemplary embodiment shown in FIG. 7, the exemplary embodiment shown here has only one step 1011.

Figure 8B:
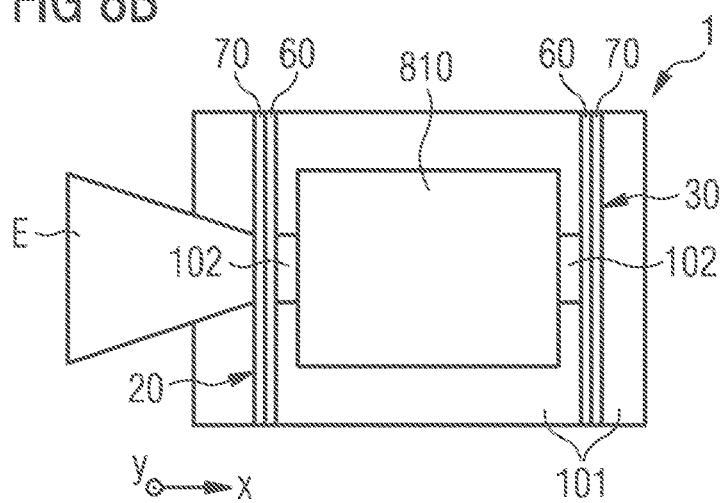

FIG. 8B shows a schematic top view of an optoelectronic semiconductor device 1 according to the first exemplary embodiment. In the plan view, the small extension of the second region 102, which does not extend over the entire width of the semiconductor body 10, is obvious. This serves in particular to limit the active region 103 located below the second region 102. This limits the expansion of the electromagnetic radiation emitted in the active region 103, which improves the beam quality advantageously.

Figure 8C:
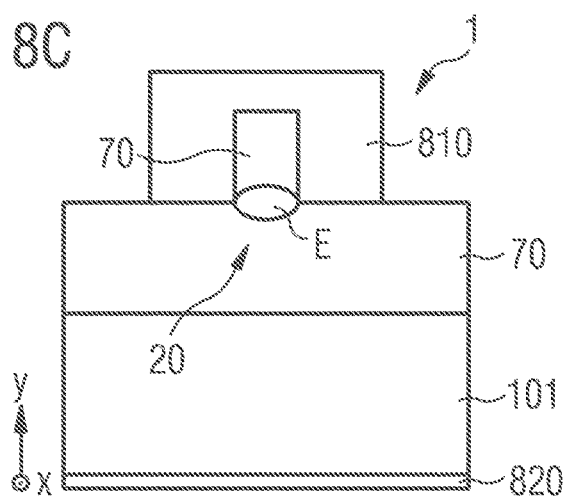

FIG. 8C shows a schematic frontal view of an optoelectronic semiconductor device 1 according to the first exemplary embodiment. The frontal view shown in FIG. 8C shows the coupling-out surface 20 of an optoelectronic semiconductor device 1. Electrical contact is made via the first contact structure 810 and a second contact structure 820 arranged on the opposite side of the first contact structure 810. Electromagnetic radiation E is coupled out in a narrowly defined region.

Figure 9A:
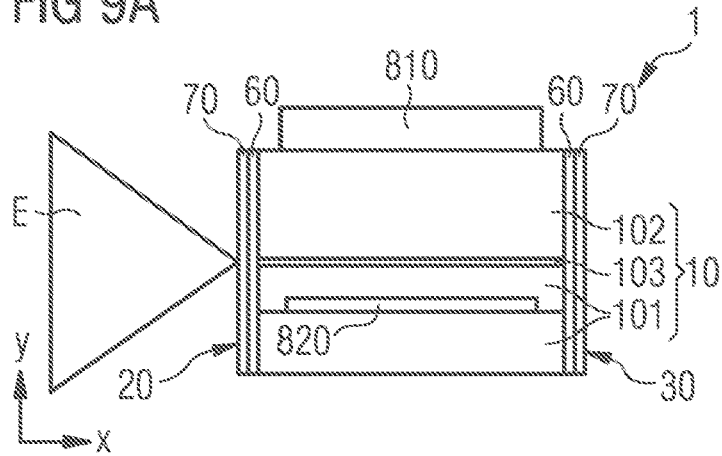
FIGS. 9A and 9B show an optoelectronic semiconductor device according to a second exemplary embodiment in a schematic cross-section and a top view.

FIG. 9A shows a schematic side view of an optoelectronic semiconductor device 1 according to the second exemplary embodiment. The second exemplary embodiment essentially corresponds to the first exemplary embodiment and differs only in the type of electrical contacting. The second contact structure 820 is arranged on another level, next to the first contact element 810. The optoelectronic semiconductor device 1 shown here is therefore suitable for mounting on an electrically non-conductive substrate, for example.

Figure 9B:
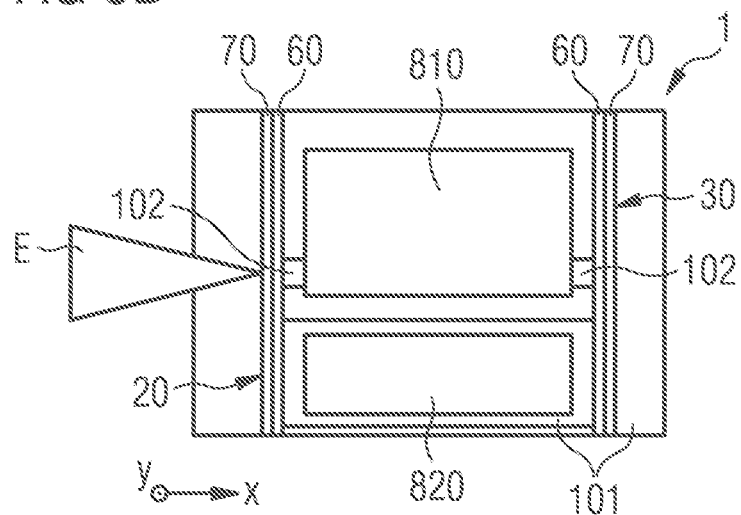

FIG. 9B shows a schematic top view of an optoelectronic semiconductor device 1 according to the second exemplary embodiment. The electrical contacting is realized by the first contact structure 810 and the second contact structure 820 arranged next to it.

Figure 10:
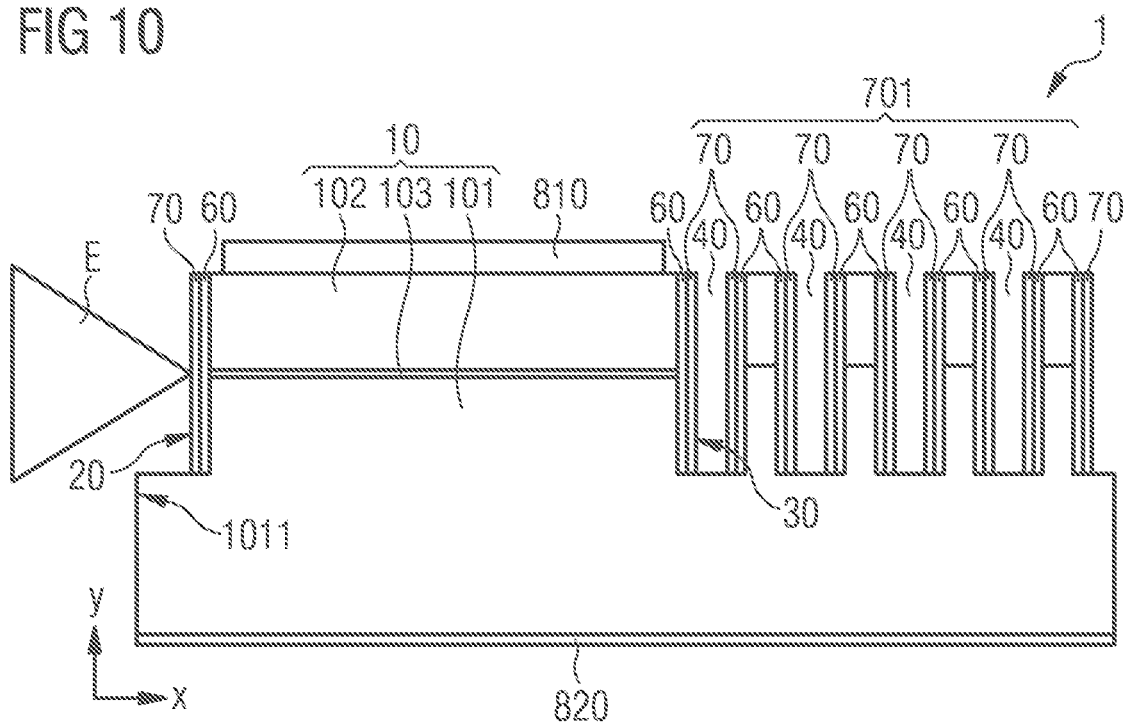
FIG. 10 shows a schematic cross-section through an optoelectronic semiconductor device according to a third exemplary embodiment.

FIG. 10 shows an optoelectronic semiconductor device 1 according to the third exemplary embodiment. The optoelectronic semiconductor device 1 shown here comprises a plurality of recesses 40 arranged on the rear surface 30 opposite the coupling-out surface 20 and forming a mirror 701. Each of the recesses 40 is provided with a passivation layer 60 and a mirror layer 70. The mirror 701 comprises a so-called DBR structure. This DBR structure is characterized in particular by spectrally selective reflectivity and very high reflectivity. The recesses 40 generate a periodic sequence of refractive index variations through the transition between the material of the semiconductor body 10 and the recesses 40. The DBR mirror is incorporated directly into the semiconductor body 10. The recesses 40 can be filled with a BCB or another transparent polymer or dielectric, in particular for increased mechanical stability and/or to adjust the refractive index. The first region 101 has a step 1011 at the coupling-out surface 20 in the longitudinal direction X.

Figure 11:
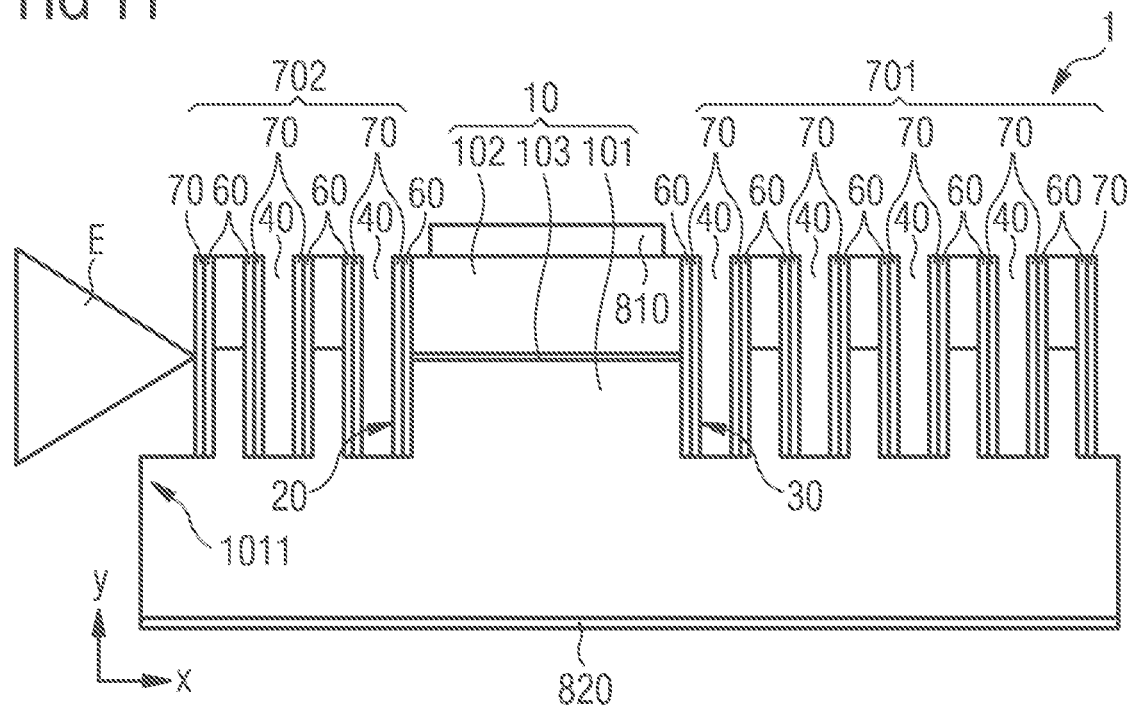
FIG. 11 shows a schematic cross-section through an optoelectronic semiconductor device according to a fourth exemplary embodiment.

FIG. 11 shows an optoelectronic semiconductor device 1 according to the fourth exemplary embodiment. The fourth exemplary embodiment essentially corresponds to the third exemplary embodiment and additionally has a further mirror 702 on the coupling-out surface 20 of the optoelectronic semiconductor device 1. This additional mirror 702 is also designed as a DBR structure and has a plurality of recesses 40, each with a passivation 60 and a mirror layer 70. The second mirror 702 is inserted directly into the semiconductor body 10. The different refractive index of the semiconductor material of the semiconductor body 10 and the material in the recesses 40 allows a periodic variation of the refractive index and thus the construction of a DBR mirror. This also applies to recesses 40 only filled with air. The first region 101 has a step 1011 on the coupling-out surface 20 in the longitudinal direction X.

Figure 12:
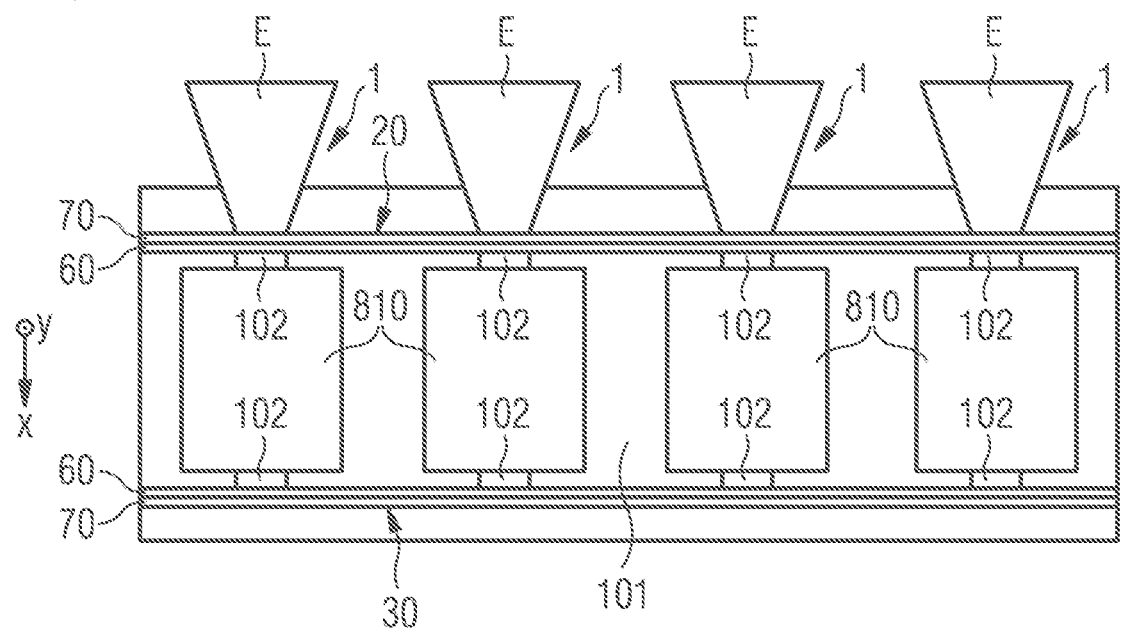
FIG. 12 shows a top view of a plurality of optoelectronic semiconductor devices in a bar configuration.

FIG. 12 shows a plurality of optoelectronic semiconductor devices 1 which are combined in a monolithic structure to form a bar. Monolithic means that the optoelectronic semiconductor devices 1 shown here are grown on a common growth substrate 900 and interconnected by the growth substrate 900 and/or epitaxially produced semiconductor layers. The manufacture of a bar comprising a plurality of optoelectronic semiconductor devices 1 can be advantageously direct and the assembly of several previously isolated optoelectronic semiconductor devices 1 can be advantageously omitted.

The invention is not limited by the description of the exemplary embodiments. Rather, the invention includes any new feature and any combination of features, which in particular includes any combination of features in the patent claims, even if that feature or combination itself is not explicitly mentioned in the patent claims or exemplary embodiments.

What is claimed is:

1. An optoelectronic semiconductor device comprising:
   a semiconductor body comprising:
      a first region of a first conductive type;
      an active region configured to generate electromagnetic radiation;
      a second region of a second conductive type;
      a coupling-out surface configured to couple-out the electromagnetic radiation,
      wherein the first region, the active region and the second region are arranged along a stacking direction,
      wherein the active region extends from a rear surface opposite the coupling-out surface to the coupling-out surface along a longitudinal direction transverse to or perpendicular to the stacking direction,
      wherein the coupling-out surface is arranged plane-parallel to the rear surface,
      wherein the first region at the coupling-out surface has at least one step in the longitudinal direction; and
      a plurality of recesses arranged directly in the semiconductor body and arranged on the rear surface and the coupling-out surface forming a mirror and a further mirror,
      wherein each of the recesses is provided with a passivation layer and a mirror layer.

2. The optoelectronic semiconductor device according to claim 1, wherein the optoelectronic semiconductor device is configured to generate coherent radiation.

3. The optoelectronic semiconductor device according to claim 1, wherein the semiconductor body has an extension in the longitudinal direction of less than 300 μm.

4. The optoelectronic semiconductor device according to claim 1, wherein at least a portion of the semiconductor body is based on a nitride compound semiconductor material.

5. The optoelectronic semiconductor device according to claim 1, wherein the coupling-out surface and the rear surface run parallel to a m-plane of a crystal of the semiconductor body.

6. The optoelectronic semiconductor device according to claim 1, wherein the coupling-out surface and the rear surface have an average roughness in a range from 0.1 nm to 10 nm.

7. The optoelectronic semiconductor device according to claim 1, wherein the step is structured so that the electromagnetic radiation emitted from the semiconductor body does not strike the step.

8. The optoelectronic semiconductor device according to claim 1, wherein the coupling-out surface and the rear surface are coated with a semi-crystalline material.

9. The optoelectronic semiconductor device according to claim 1, wherein the coupling-out surface and the rear surface are coated with a dielectric material.

10. The optoelectronic semiconductor device according to claim 1, wherein the coupling-out surface and the rear surface are coated with a metal.

11. The optoelectronic semiconductor device according to claim 1, wherein the coupling-out surface and the rear surface of the semiconductor body are produced by an etching process and a chemical polishing process to ensure low surface roughness and high plane-parallelism of the coupling-out surface and the rear surface.

12. The optoelectronic semiconductor device according to claim 11, wherein characteristics of the coupling-out surface and the rear surface being produced by the etching process are verifiable on the optoelectronic semiconductor device, and wherein the characteristics are irregularities on the coupling-out surface and the rear surface caused by different etching rates in different materials or steps on the rear surface and the coupling-out surface.

13. The optoelectronic semiconductor device according to claim 11, wherein a characteristic of the coupling-out surface and the rear surface being produced by the etching process are verifiable on the optoelectronic semiconductor device, and wherein the characteristic is a distance of less than 300 µm between the coupling-out surface and the rear surface.

* * * * *